(12) United States Patent
Lee et al.

(10) Patent No.: US 12,310,160 B2
(45) Date of Patent: May 20, 2025

(54) STRETCHABLE PIXEL ARRAY SUBSTRATE

(71) Applicant: AUO Corporation, Hsinchu (TW)

(72) Inventors: Kent-Yi Lee, Hsinchu (TW); Wen-Ting Wang, Hsinchu (TW); Chia-Kai Chen, Hsinchu (TW); Chih-Ling Hsueh, Hsinchu (TW)

(73) Assignee: AUO Corporation, Hsinchu (TW)

( * ) Notice: Subject to any disclaimer, the term of this patent is extended or adjusted under 35 U.S.C. 154(b) by 531 days.

(21) Appl. No.: 17/881,619

(22) Filed: Aug. 5, 2022

(65) Prior Publication Data

US 2023/0369382 A1 Nov. 16, 2023

(30) Foreign Application Priority Data

May 16, 2022 (TW) .................... 111118282

(51) Int. Cl.
*H10H 29/14* (2025.01)
*H10H 20/857* (2025.01)

(52) U.S. Cl.
CPC ........ *H10H 29/142* (2025.01); *H10H 20/857* (2025.01)

(58) Field of Classification Search
CPC .. H10H 29/142; H10H 20/857; H05K 1/0283; H01L 25/0753; H10D 86/411; H10D 86/441; H10D 86/443; H10D 86/60
See application file for complete search history.

(56) References Cited

U.S. PATENT DOCUMENTS

| | | | | |
|---|---|---|---|---|
| 11,980,072 B2 * | 5/2024 | Huang | ................. | H10K 59/131 |
| 12,034,106 B2 * | 7/2024 | Jiang | ................... | H01L 25/0753 |
| 2018/0046221 A1 * | 2/2018 | Choi | ...................... | H05B 33/22 |
| 2019/0019966 A1 * | 1/2019 | Jiang | .................... | H10K 59/131 |
| 2019/0107911 A1 * | 4/2019 | Zhai | ....................... | G06F 3/0443 |
| 2020/0137472 A1 * | 4/2020 | Won | .......................... | H04R 3/12 |
| 2020/0243778 A1 * | 7/2020 | Li | ......................... | H10K 77/111 |
| 2020/0328269 A1 * | 10/2020 | Shin | ..................... | H10K 59/124 |
| 2020/0409419 A1 * | 12/2020 | He | ........................ | G06F 1/189 |

(Continued)

FOREIGN PATENT DOCUMENTS

| | | |
|---|---|---|
| CN | 109817687 | 5/2019 |
| CN | 111326542 | 6/2020 |

(Continued)

OTHER PUBLICATIONS

Zih-Shuo Huang et al., "Display Device", Unpublished U.S. Appl. No. 17/513,912, filed Oct. 29, 2021.

*Primary Examiner* — Victor A Mandala
(74) *Attorney, Agent, or Firm* — JCIPRNET (57) ABSTRACT

A stretchable pixel array substrate includes a base, pixel structures and a gate driving circuit electrically connected to the pixel structures. The base has an active area and a peripheral area outside the active area. The peripheral area has openings to define first islands, second islands and first bridges of the peripheral area. An area of each of the first islands is greater than an area of each of the second islands. At least a part of the first bridges is connected between the first islands and the second islands. The pixel structures are disposed on the active area of the base. The gate driving circuit includes first parts disposed on the first islands and second parts disposed on the second islands and electrically connected to the first parts.

15 Claims, 10 Drawing Sheets

(56) References Cited

U.S. PATENT DOCUMENTS

| | | | | |
|---|---|---|---|---|
| 2021/0049939 | A1* | 2/2021 | Sui | G06F 1/1652 |
| 2021/0193774 | A1* | 6/2021 | Won | H10K 59/131 |
| 2021/0208446 | A1* | 7/2021 | Yang | H10K 77/111 |
| 2021/0225984 | A1* | 7/2021 | Wang | H10K 50/844 |
| 2021/0376267 | A1* | 12/2021 | Zhang | H10K 59/65 |
| 2021/0408409 | A1* | 12/2021 | Wang | G09F 9/301 |
| 2022/0328593 | A1* | 10/2022 | Song | H10K 59/87 |
| 2022/0344612 | A1* | 10/2022 | Jia | H10K 71/00 |
| 2022/0399484 | A1* | 12/2022 | Jiang | H10H 20/815 |
| 2023/0109049 | A1* | 4/2023 | Wang | B32B 3/30 |
| | | | | 361/807 |
| 2023/0117283 | A1* | 4/2023 | Wang | G06F 1/1652 |
| | | | | 361/679.27 |
| 2023/0354657 | A1* | 11/2023 | Huang | H10K 77/111 |
| 2024/0030236 | A1* | 1/2024 | Hu | H10D 86/60 |
| 2024/0031463 | A1* | 1/2024 | Yin | H04M 1/0268 |
| 2024/0053841 | A1* | 2/2024 | Hu | G06F 1/1652 |

FOREIGN PATENT DOCUMENTS

| | | |
|---|---|---|
| CN | 111341813 | 6/2020 |
| CN | 112258994 | 1/2021 |
| CN | 113629066 | 11/2021 |

* cited by examiner

STRETCHABLE PIXEL ARRAY SUBSTRATE

CROSS-REFERENCE TO RELATED APPLICATION

This application claims the priority benefit of Taiwan application serial no. 111118282, filed on May 16, 2022. The entirety of the above-mentioned patent applications is hereby incorporated by reference herein and made a part of this specification.

BACKGROUND

Technical Field

The disclosure relates to a pixel array substrate, and in particular relates to a stretchable pixel array substrate.

Description of Related Art

With the increasing development of electronic technology, electronic products are constantly innovating. In order to apply electronic products in various fields, the characteristics of stretchability, thinness, and unrestricted appearance have gradually become more valuable. That is to say, electronic products are gradually required to have different appearances according to different applications and environments, therefore electronic products need to be stretchable.

However, when the electronic product is stretched, it may cause structural fracture due to stress, and even further cause the internal circuit to be disconnected. Therefore, how to make stretchable electronic products with good manufacturing yield and product reliability is an urgent problem to be solved at present.

SUMMARY

The disclosure provides a stretchable pixel array substrate with good stretchability.

The stretchable pixel array substrate of the disclosure includes a base, multiple pixel structures, and a gate driving circuit electrically connected to the pixel structures. The base has an active area and a peripheral area outside the active area. The peripheral area has multiple openings to define multiple first islands, multiple second islands, and multiple first bridges of the peripheral area. An area of each of the first islands is greater than an area of each of the second islands. At least a part of the first bridges is connected between the first islands and the second islands. The pixel structures are disposed on the active area of the base. The gate driving circuit includes multiple first parts disposed on the first islands and multiple second parts disposed on the second islands and electrically connected to the first parts.

In an embodiment of the disclosure, each of the first islands has an upper edge, a lower edge, a first side, and a second side. The upper edge is disposed opposite to the lower edge, the first side is connected between the upper edge and the lower edge, and the second side is disposed opposite to the first side and is connected between the upper edge and the lower edge. A length of the upper edge is greater than or equal to a length of the lower edge, and a length of the first side and a length of the second side is less than the length of the lower edge.

In an embodiment of the disclosure, each of the second islands has a first side adjacent to the first island, and the first side of the second island and the first side of the first island form an acute angle.

In an embodiment of the disclosure, the acute angle is $\theta$, and $8° \leq \theta \leq 40°$.

In an embodiment of the disclosure, the acute angle is $\theta$, and $10° \leq \theta \leq 35°$.

In an embodiment of the disclosure, each of the first islands has a width b in a direction parallel to the first side, one of the first parts of the gate driving circuit disposed on the first island has a width a in the direction, and $b/6 \leq a \leq 2b/3$.

In an embodiment of the disclosure, one of the first parts of the gate driving circuit has a first edge and a second edge opposite to each other, the first edge and the second edge are respectively adjacent to the upper edge and the lower edge of each of the first islands. The second edge of the one of the first portions of the gate driving circuit has an arc-shaped structure concave toward the first edge.

In an embodiment of the disclosure, a distance between the arc-shaped structure of the one of the first parts of the gate driving circuit and the lower edge of each of the first islands gradually changes as the distance moves away from the first side of the first island.

In an embodiment of the disclosure, each of the first islands in the peripheral area of the substrate includes a first part and a second part. The peripheral area of the substrate further has a second bridge, and the second bridge is connected between the first part of the first island and the second part of the first island. The peripheral area of the base further has a meandering structure, and the meandering structure is disposed opposite to the second bridge and connected between the first part of the first island and the second part of the first island.

In an embodiment of the disclosure, the first parts of the gate driving circuit include multiple active elements, and the second parts include multiple passive elements.

In an embodiment of the disclosure, each of the first islands has an upper edge, a lower edge, a first side, and a second side. The upper edge is disposed opposite to the lower edge, the first side is connected between the upper edge and the lower edge, and the second side is disposed opposite to the first side and is connected between the upper edge and the lower edge. A length of the upper edge is greater than or equal to a length of the lower edge, a length of the first side and a length of the second side is less than the length of the lower edge, and the active elements are arranged along the upper edge of the first island.

In an embodiment of the disclosure, the first islands in the peripheral area of the base, the second islands in the peripheral area of the base, the first bridges in the peripheral area of the base, and the gate driving circuit are divided into multiple structural units. Each of the structural units include at least one of the first island, one of the second islands adjacent to the first island, one of the first bridges connected between the first island and the second island, and one of the first parts of the gate driving circuit and one of the second parts of the gate driving circuit respectively disposed on the first island and the second island. The structural units are arranged in multiple structural unit columns and multiple structural unit rows, and one of the structural unit rows and a next one of the structural unit rows are mirror-symmetrical to one another.

In an embodiment of the disclosure, curving directions of the first islands of the structural units belonging to the same structural unit row and respectively belonging to two of the adjacent structural unit columns are opposite to each other.

In an embodiment of the disclosure, the structural unit column and a next one of the structural unit columns are mirror-symmetrical to one another.

In an embodiment of the disclosure, each of the structural units further includes another one of the second islands adjacent to the first island. The second island and the another one of the second islands of each of the structural units are respectively located on opposite sides of the first island. Each of the structural units further includes another one of the first bridges connected between the first island and the another one of the second islands. Each of the structural units further includes another one of the second parts of the gate driving circuit, and the another one of the second parts of the gate driving circuit is disposed on the another one of the second islands.

DETAILED DESCRIPTION OF DISCLOSED EMBODIMENTS

References of the exemplary embodiments of the disclosure are to be made in detail. Examples of the exemplary embodiments are illustrated in the drawings. If applicable, the same reference numerals in the drawings and the descriptions indicate the same or similar parts.

It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, or being within ±30%, ±20%, ±10%, or ±5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Figure 1:
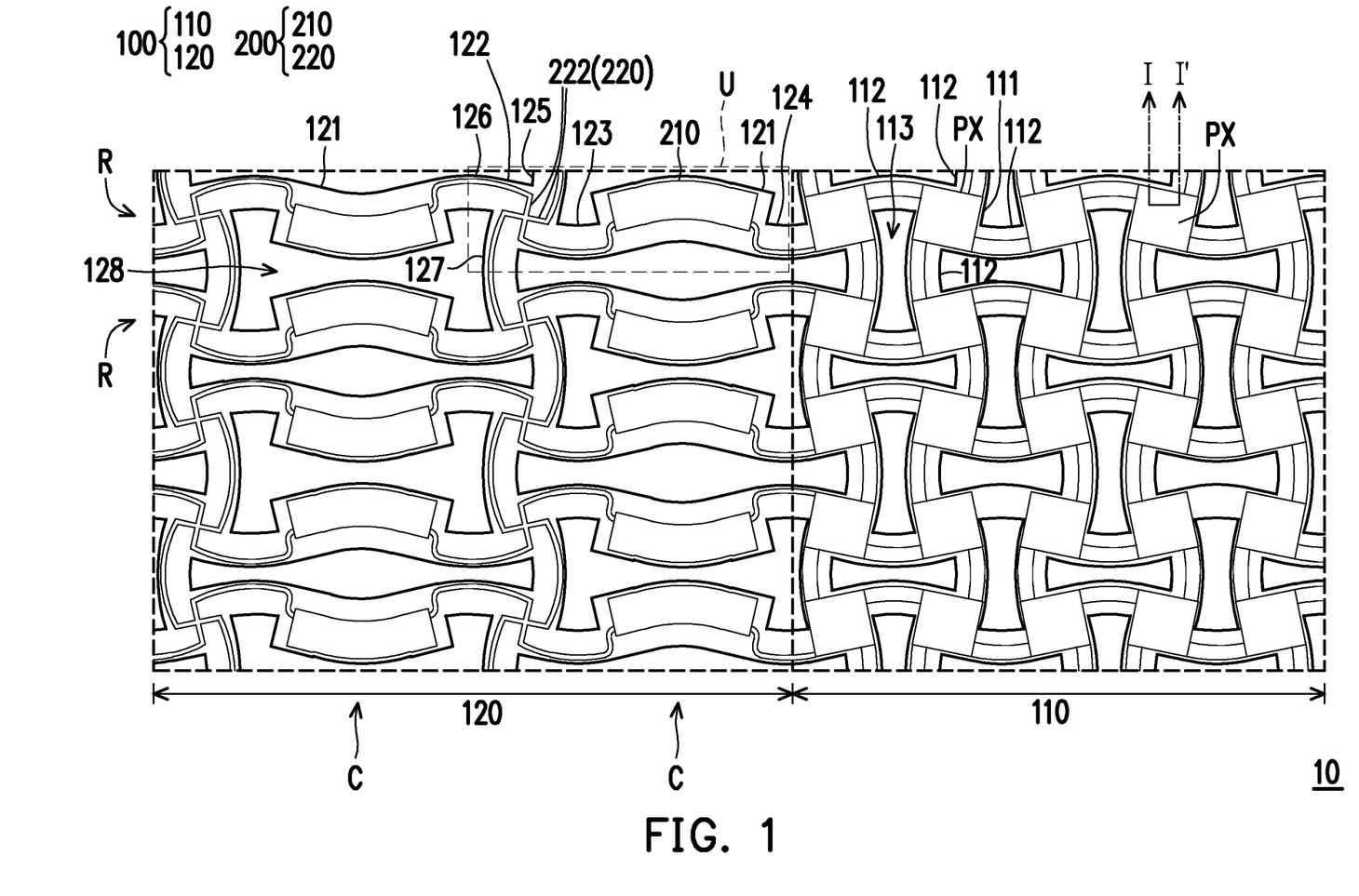
FIG. 1 is a top schematic view of a stretchable pixel array substrate 10 according to an embodiment of the disclosure.
Figure 2:
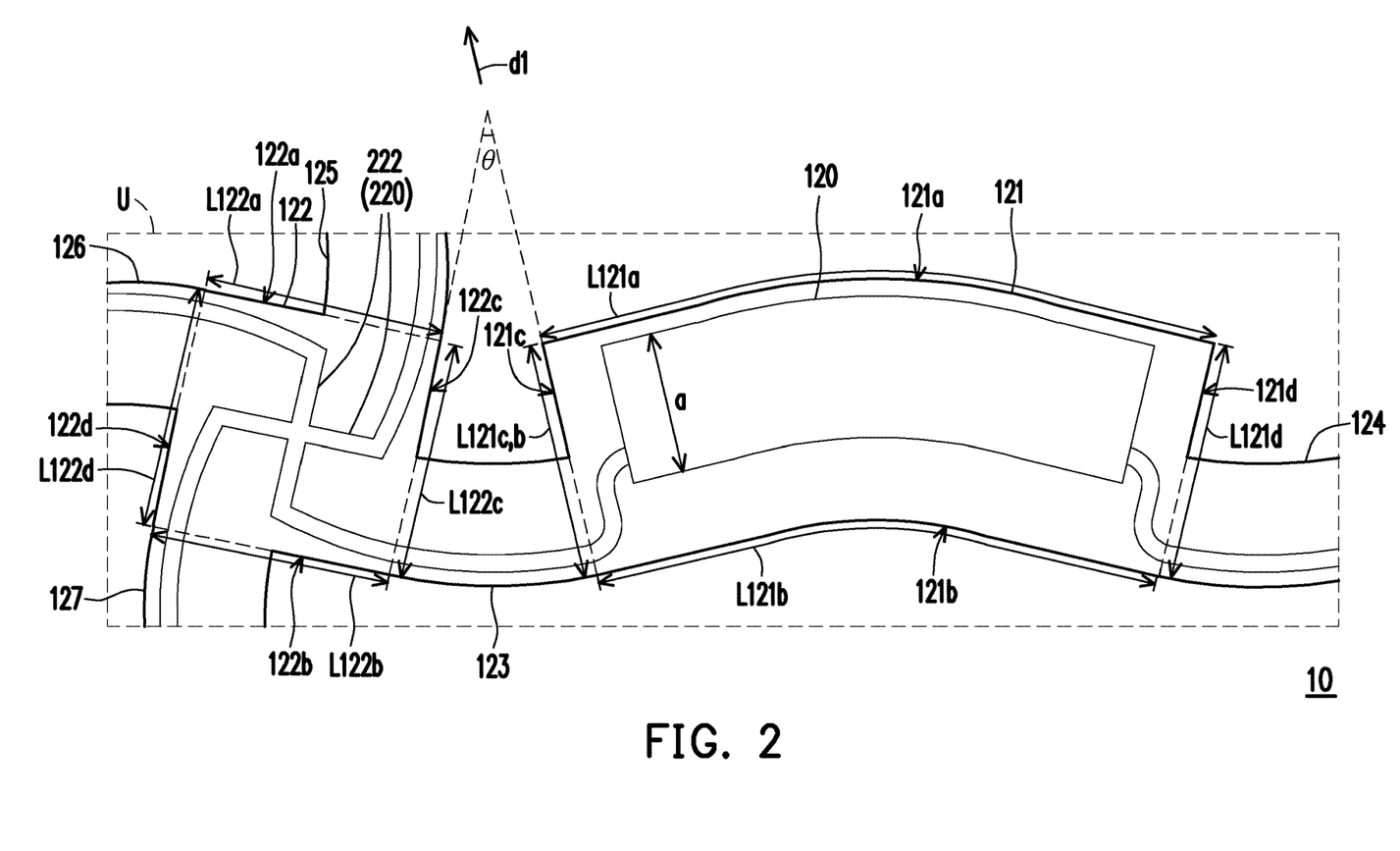
FIG. 2 is an enlarged schematic view of a structural unit U of the stretchable pixel array substrate 10 according to an embodiment of the disclosure.

FIG. 1 is a top schematic view of a stretchable pixel array substrate 10 according to an embodiment of the disclosure. FIG. 2 is an enlarged schematic view of a structural unit U of the stretchable pixel array substrate 10 according to an embodiment of the disclosure.

Referring to FIG. 1, the stretchable pixel array substrate 10 includes a base 100. The base 100 has elasticity and extensibility. For example, in this embodiment, the material of the base 100 may include polyimide (PI), polyethylene naphthalate (PEN), polyethylene terephthalate (PET), polycarbonates (PC), polyether sulfone (PES) or polyarylate, or a combination of at least two of the foregoing materials, but the disclosure is not limited thereto.

The base 100 has an active area 110 and a peripheral area 120 outside the active area 110. In this embodiment, the active area 110 is a display area used for displaying an image, and the peripheral area 120 is located beside at least one side of the display area. For example, in this embodiment, the peripheral area 120 may be a rectangular-shaped area surrounding the active area 110, but the disclosure is not limited thereto.

Referring to FIG. 1 and FIG. 2, the peripheral area 120 of the base 100 has multiple openings 128 to define multiple first islands 121, multiple second islands 122, and multiple first bridges 123, 124, 125, 126, and 127 of the peripheral area 120. The area of each of the first islands 121 is larger than that of each of the second islands 122, and at least a part of the first bridges 123, 124, 125, 126, and 127 is connected between the first islands 121 and the second islands 122.

Referring to FIG. 2, in this embodiment, each of the first islands 121 has an upper edge 121a, a lower edge 121b, a first side 121c, and a second side 121d. The upper edge 121a is disposed opposite to the lower edge 121b, the first side 121c is connected between the upper edge 121a and the lower edge 121b, and the second side 121d is disposed opposite to the first side 121c and is connected between the upper edge 121a and the lower edge 121b. A length L121a of the upper edge 121a is greater than or equal to a length L121b of the lower edge 121b, and a length L121c of the first side 121c and a length L121d of the second side 121d is less than the length L121b of the lower edge 121b. In short, in this embodiment, the first island 121 may be an elongated region. In addition, in this embodiment, the length L121a of the upper edge 121a of the first island 121 may be between 100 μm and 800 μm; preferably, the length L121a of the upper edge 121a of the first island 121 may be between 300 μm and 700 μm; but the disclosure is not limited thereto.

In this embodiment, each of the second islands 122 has an upper edge 122a, a lower edge 122b, a first side 122c, and a second side 122d. The upper edge 122a is disposed opposite to the lower edge 122b, the first side 122c is connected between the upper edge 122a and the lower edge 122b, and the second side 122d is disposed opposite to the first side 122c and is connected between the upper edge 122a and the lower edge 122b. A length L122a of the upper edge 122a is substantially equal to a length L122b of the lower edge 122b, and a length L122c of the first side 122c and a length L122d of the second side 122d is substantially equal to the length L122b of the lower edge 122b. In short, in this embodiment, the second island 122 may be a square area, and the area of the first island 121 in an elongated shape is larger than the area of the second island 122 in a square shape. For example, in this embodiment, the area of the first island 121 may be larger than twice the area of the second island 122, but the disclosure is not limited thereto.

In this embodiment, the multiple first bridges 123, 124, 125, 126, and 127 include a first bridge 123, a first bridge 124, a first bridge 125, a first bridge 126, and a first bridge 127. The first bridge 123 and the first bridge 124 are respectively connected to the first side 121c and the second side 121d of the first island 121, and the first bridge 123c is connected between the first side 121c of the first island 121 and the first side 122c of the second island 122. The first bridge 125, the first bridge 126, and the first bridge 127 are respectively connected to the upper edge 122a, the second side 122d, and the lower edge 122b of the second island 122. That is to say, in this embodiment, the left and right sides of the first island 121 with a larger area are connected with multiple first bridges 123 and 124, but the upper and lower sides of the first island 121 with a larger area are not connected with any bridges, and the upper, lower, left, and right sides of the second island 122 with a smaller area are respectively connected with multiple first bridges 123, 125, 126, and 127.

Referring to FIG. 2, in this embodiment, the second island 122 has a first side 122c adjacent to the first island 121. An acute angle θ is formed between the first side 122c of the second island 122 and the first side 121c of the first island 121. For example, in this embodiment, 8°≤θ≤40°; preferably, 10°≤θ≤35°, but the disclosure is not limited thereto.

Referring to FIG. 1, in this embodiment, the active area 110 of the base 100 has multiple openings 113 to define multiple islands 111 and multiple bridges 112 of the active area 110 of the base 100, in which two adjacent islands 111 are connected to each other through a bridge 112. In this embodiment, the areas of the islands 111 of the active area 110 of the base 100 are substantially the same, unlike the peripheral area 120 of the base 100 having the first island 121 and the second island 122 with different areas. In this embodiment, the area of the small island (i.e., the second island 122) of the peripheral area 120 may be greater than or equal to the area of the island 111 of the active area 110.

Figure 3:
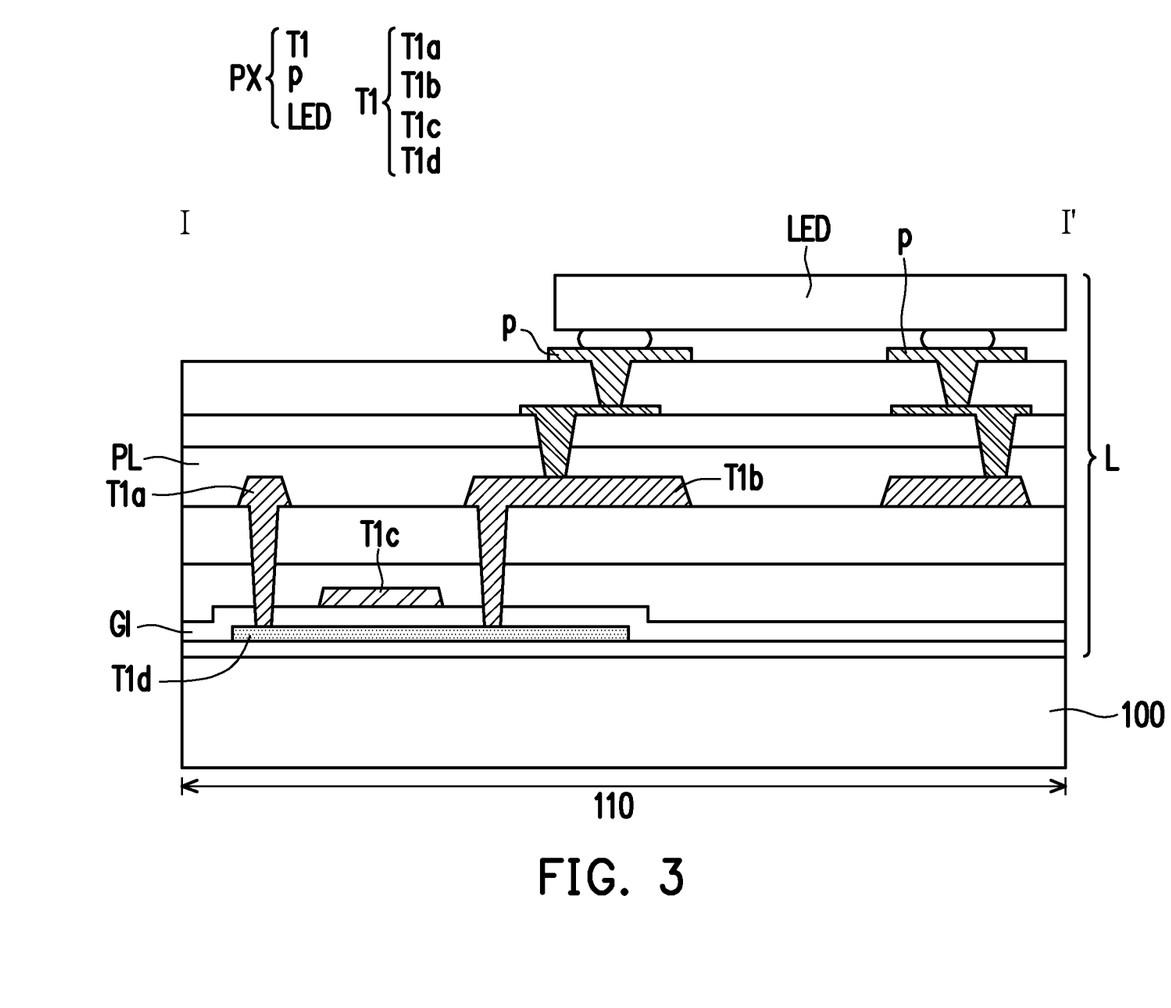
FIG. 3 is a cross-sectional schematic view of the stretchable pixel array substrate 10 according to an embodiment of the disclosure.

FIG. 3 is a cross-sectional schematic view of the stretchable pixel array substrate 10 according to an embodiment of the disclosure. FIG. 3 corresponds to a section line I-I' in FIG. 1.

Referring to FIG. 1 and FIG. 3, the stretchable pixel array substrate 10 further includes an element layer L (marked in FIG. 3). The element layer L has multiple pixel structures PX. The pixel structures PX are disposed on the active area 110 of the base 100. In detail, in this embodiment, the pixel structures PX may be respectively disposed on the islands 111 of the active area 110.

Referring to FIG. 3, for example, in this embodiment, each of the pixel structures PX may include a first transistor T1, a pair of pads p, and a light-emitting diode element LED. The first transistor T1 has a first terminal T1a, a second terminal T1b, a control terminal T1c, and a semiconductor pattern T1d. The first terminal T1a and the second terminal T1b are respectively electrically connected to two different areas of the semiconductor pattern T1d. A first insulating layer GI is disposed between the control terminal T1c and the semiconductor pattern T1d of the first transistor T1, and a second insulating layer PL is disposed between the first transistor T1 and the pair of pads p. The pair of pads p is electrically connected to the second terminal T1b of the first transistor T1, and a pair of electrodes (not shown) of the light-emitting diode element LED is electrically connected to the pair of pads p. In this embodiment, each of the pixel structures PX may optionally further include a second transistor (not shown). The second transistor has a first terminal, a second terminal, and a control terminal. The second terminal of the second transistor is electrically connected to the control terminal T1c of the first transistor T1; but the disclosure is not limited thereto.

Figure 4:
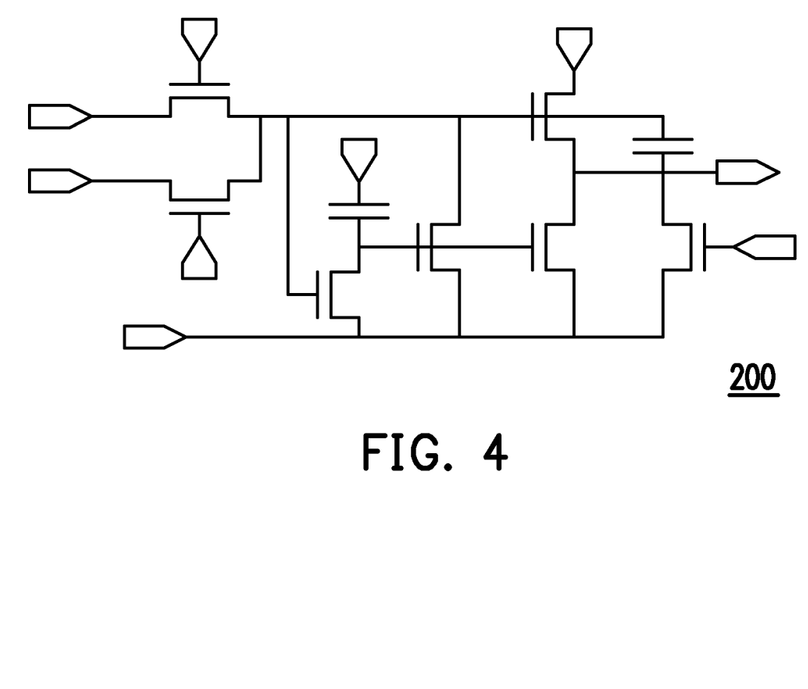
FIG. 4 is a schematic view of an equivalent circuit of a gate driving circuit 200 according to an embodiment of the disclosure.

FIG. 4 is a schematic view of an equivalent circuit of a gate driving circuit 200 according to an embodiment of the disclosure. Referring to FIG. 1, FIG. 2, FIG. 3, and FIG. 4, the element layer L of the stretchable pixel array substrate 10 further has the gate driving circuit 200. The gate driving circuit 200 is electrically connected to the pixel structures PX. Specifically, in this embodiment, each of the pixel structures PX further includes a scan line (not shown). The scan line is electrically connected to the control terminal of the second transistor of the aforementioned pixel structure PX, and the gate driving circuit 200 is electrically connected to the scan line.

Please refer to FIG. 1 and FIG. 2, the gate driving circuit 200 includes a plurality of first parts 210 and a plurality of second parts 220. The first parts 210 of the gate driving circuit 200 are disposed on the first islands 121 of the peripheral area 120 of the base 100. The second parts 220 of the gate driving circuit 200 are disposed on the second islands 122 of the peripheral area 120 of the base 100 and are electrically connected to the first parts 210. The first part 210 and the second part 220 of the gate driving circuit 200 are respectively disposed on the first island 121 and the second island 122 with different areas, so that when the stretchable pixel array substrate 10 is flexed, the gate driving circuit 200 is not easily damaged, thereby improving the stretchability.

Figure 5:
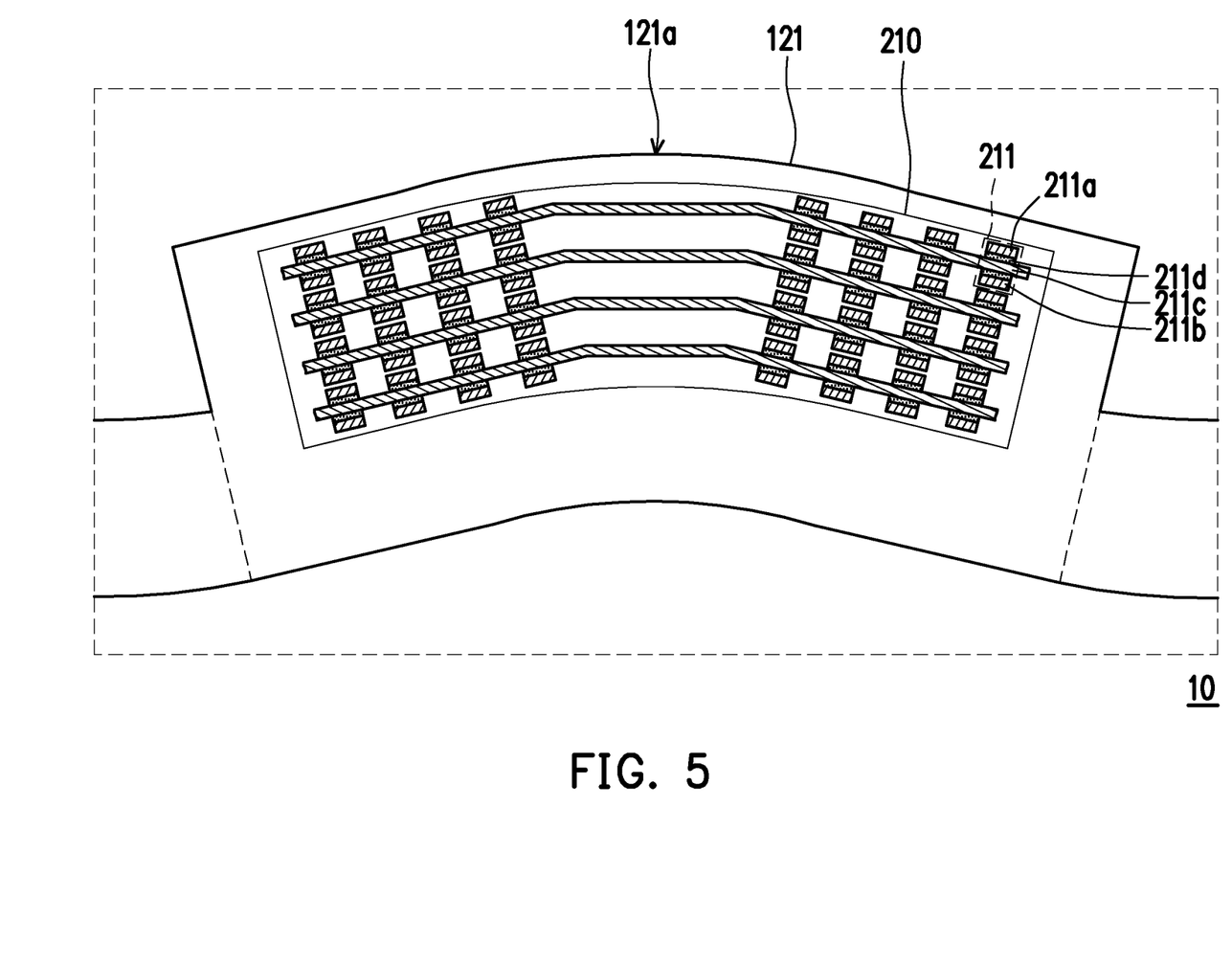
FIG. 5 shows multiple active elements 211 of a first part 210 of the gate driving circuit 200 of the stretchable pixel array substrate 10 according to an embodiment of the disclosure.

FIG. 5 shows multiple active elements 211 of a first part 210 of the gate driving circuit 200 of the stretchable pixel array substrate 10 according to an embodiment of the disclosure. FIG. 5 omits the second part 220 of the gate driving circuit 200.

Referring to FIG. 1, FIG. 2, and FIG. 5, in this embodiment, the first part 210 of the gate driving circuit 200 includes multiple active elements 211, and the second part 220 of the gate driving circuit 200 includes multiple passive elements 222. For example, in this embodiment, the active element 211 of the first part 210 of the gate driving circuit 200 may be a thin film transistor, and the passive element 222 of the second part 220 of the gate driving circuit 200 may be a conductive line (for example, but not limited to: a power line). Referring to FIG. 5, each of the active elements 211 (i.e., thin film transistor) has a first terminal 211a, a second terminal 211b, a control terminal 211c, and a semiconductor pattern 211d. The first terminal 211a and the second terminal 211b are respectively electrically connected to two different areas of the semiconductor pattern 211d, and a first insulating layer GI (refer to FIG. 2) is disposed between the control terminal 211c and the semiconductor pattern 211d. In this embodiment, the boundary of the first part 210 of the gate driving circuit 200 may be defined by the sidewall (not marked) of the first insulating layer GI (refer to FIG. 2). In this embodiment, the active elements 211 of the first part 210 of the gate driving circuit 200 may be arranged along the upper edge 121a of the first island 121 of the base 100.

Referring to FIG. 2, in this embodiment, the first island 121 of the peripheral area 120 of the base 100 has a width b in a direction d1 parallel to the first side 121c, and the first portion 210 of the gate driving circuit 200 disposed on the first island 121 has a width a in the direction d1, and b/6≤a≤2b/3. The first part 210 of the gate driving circuit 200 does not occupy the entire area of the first island 121. The first portion 210 of the gate driving circuit 200 is disposed in an area farther from the first bridges 123 and 124 and is not disposed in an area close to the first bridges 123 and 124 as much as possible. In this way, the first part 210 of the gate driving circuit 200 may avoid the stress concentration area (i.e., the area of the first island 121 that is closer to the first bridges 123 and 124), thereby improving the stretchability of the stretchable pixel array substrate 10. In this embodiment, 10 μm≤b≤250 μm, but the disclosure is not limited thereto.

Referring to FIG. 1, in this embodiment, the first islands 121 of the peripheral area 120 of the base 100, the second islands 122 of the peripheral area 120 of the base 100, the first bridges 123, 124, 125, 126, 127, and the gate driving circuit 200 of the peripheral region 120 of the substrate 100 may be divided into multiple structural units U. Each of the structural units U at least includes a first island 121, a second island 122 adjacent to the first island 121, a first bridge 123 connected between the first island 121 and the second island 122, and the first part 210 and the second part 220 of the gate driving circuit 200 respectively disposed on the first island 121 and the second island 122.

In this embodiment, the structural units U may be arranged into multiple structural unit columns C and multiple structural unit rows R, and one structural unit row R and the next structural unit row R may be mirror-symmetrical to each other. In addition, in this embodiment, the curving directions of the first islands 121 of the structural units U belonging to the same structural unit row R and respectively belonging to two adjacent structural unit columns C are opposite to each other. For example, in this embodiment, the first islands 121 of the structural units U belonging to the same uppermost structural unit row R and respectively belonging to the two adjacent structural unit columns C on the left and right are respectively curved upward and downward, but the disclosure is not limited thereto.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 6:
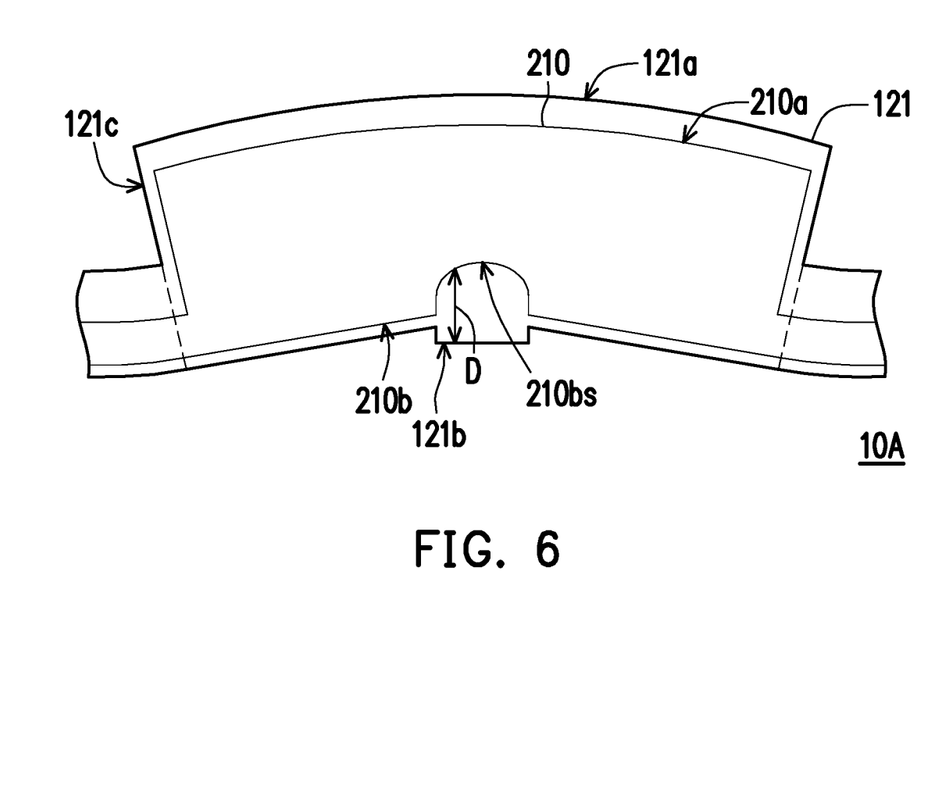
FIG. 6 shows a first island 121 of a stretchable pixel array substrate 10A and the first part 210 of the gate driving circuit 200 according to another embodiment of the disclosure.

FIG. 6 shows a first island 121 of a stretchable pixel array substrate 10A and the first part 210 of the gate driving circuit 200 according to another embodiment of the disclosure.

Referring to FIG. 6, in this embodiment, the first part 210 of the gate driving circuit 200 has a first edge 210a and a second edge 210b opposite to each other. The first edge 210a and the second edge 210b are respectively adjacent to the upper edge 121a and the lower edge 121b of the first island 121. The second edge 210b of the first portion 210 of the gate driving circuit 200 has an arc-shaped structure 210bs concave toward the first edge 210a. A distance D between the arc-shaped structure 210bs of the first part 210 of the gate driving circuit 200 and the lower edge 121b of the first island 121 gradually changes as the distance D moves away from the first side 121c of the first island 121. Specifically, the distance D between the arc structure 210bs of the first part 210 of the gate driving circuit 200 and the lower edge 121b of the first island 121 first increases and then decreases gradually as the distance D moves away from the first side 121c of the first island 121. The arc-shaped structure 210bs of the first part 210 of the gate driving circuit 200 is a strain resistant design. Through the arc structure 210bs, the stretchability of the stretchable pixel array substrate 10A is further improved.

Figure 7:
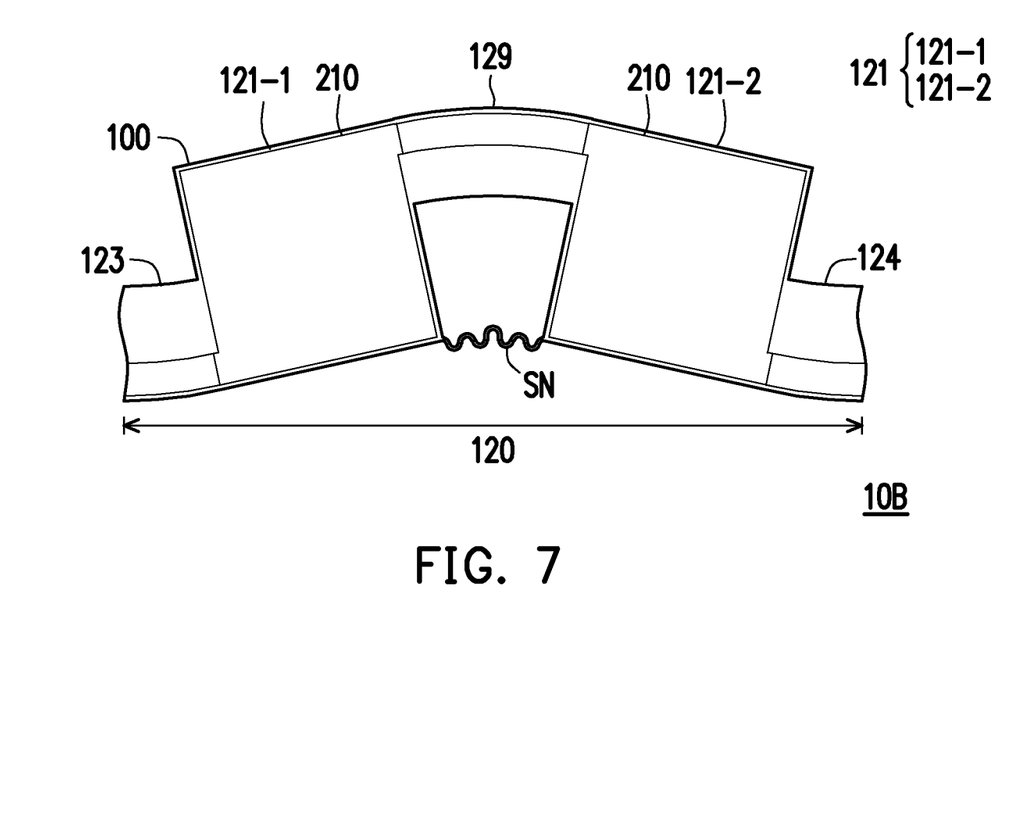
FIG. 7 shows a first island 121 of a stretchable pixel array substrate 10B and the first part 210 of the gate driving circuit 200 according to still another embodiment of the disclosure.

FIG. 7 shows a first island 121 of a stretchable pixel array substrate 10B and the first part 210 of the gate driving circuit 200 according to still another embodiment of the disclosure.

Referring to FIG. 7, in this embodiment, the first island 121 includes a first part 121-1 and a second part 121-2. The peripheral area 120 of the base 100 further has a second bridge 129. The second bridge 129 is connected between the first part 121-1 of the first island 121 and the second part 121-2 of the first island 121. The peripheral area 120 of the base 100 further has a meandering structure SN. The meandering structure SN is disposed opposite to the second bridge 129 and connected between the first part 121-1 and the second part 121-2 of the first island 121. The meandering structure SN is another strain resistant design. Through the meandering structure SN, the stretchability of the stretchable pixel array substrate 10B is further improved.

Figure 8:
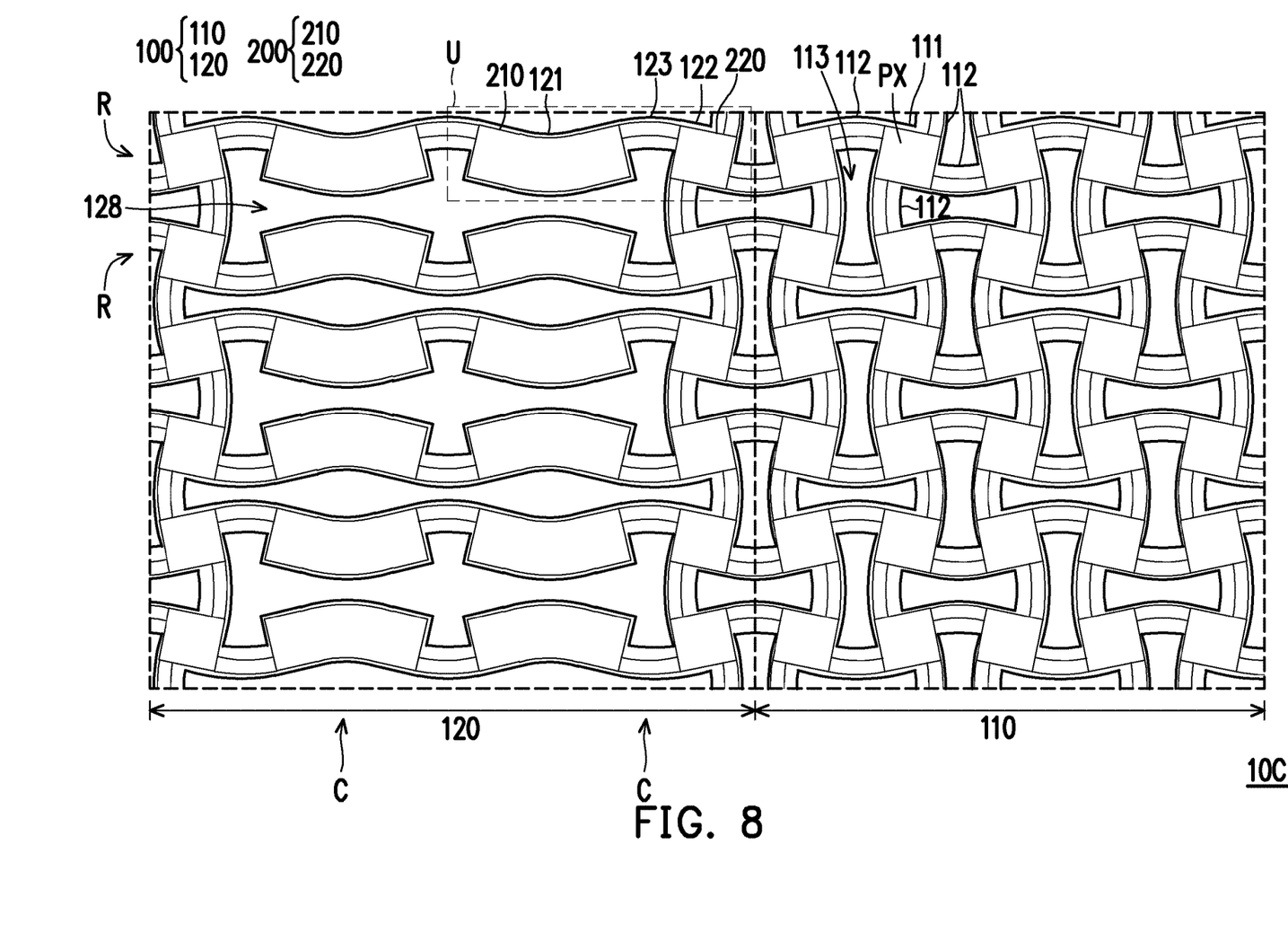
FIG. 8 is a top schematic view of a stretchable pixel array substrate 10C according to still another embodiment of the disclosure.

FIG. 8 is a top schematic view of a stretchable pixel array substrate 10C according to still another embodiment of the disclosure. The stretchable pixel array substrate 10C of FIG. 8 is similar to the stretchable pixel array substrate 10 of FIG. 1, and the differences between the two are explained as follows.

Referring to FIG. 8, in this embodiment, not only a structural unit row R and the next structural unit row R are mirror-symmetrical to each other, but also the structural unit column C and the next structural unit column C are mirror-symmetrical to each other.

Figure 9:
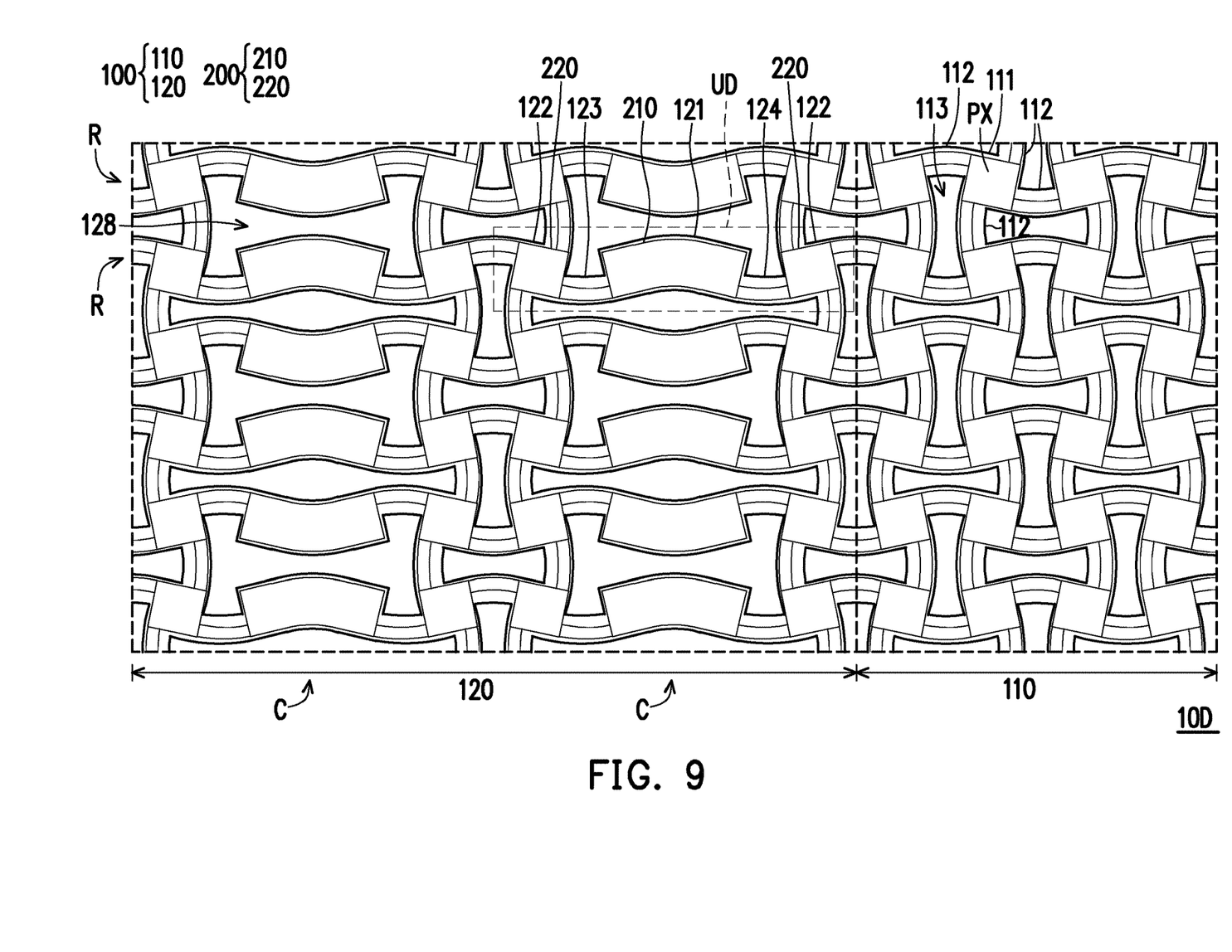
FIG. 9 is a top schematic view of a stretchable pixel array substrate 10D according to an embodiment of the disclosure.
Figure 10:
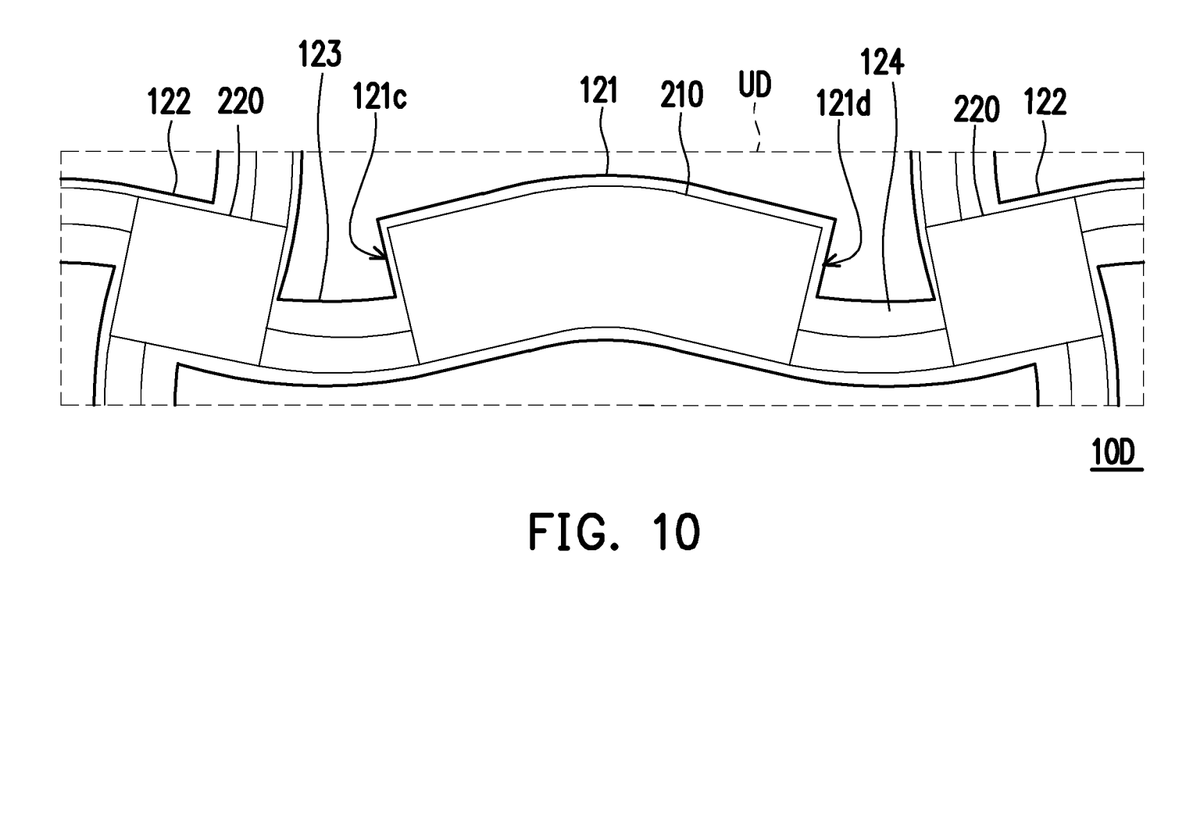
FIG. 10 is an enlarged schematic view of a structural unit UD of the stretchable pixel array substrate 10D according to an embodiment of the disclosure.

FIG. 9 is a top schematic view of a stretchable pixel array substrate 10D according to an embodiment of the disclosure. FIG. 10 is an enlarged schematic view of a structural unit UD of the stretchable pixel array substrate 10D according to an embodiment of the disclosure.

The stretchable pixel array substrate 10D of FIG. 9 and the structural unit UD of FIG. 10 are respectively similar to the stretchable pixel array substrate 10 of FIG. 1 and the structural unit U of FIG. 2, and the differences are explained as follows.

Referring to FIG. 9 and FIG. 10, in this embodiment, each of the structural units UD further includes another second island 122 adjacent to the first island 121. A second island 122 and another second island 122 of each of the structural units UD are respectively located on opposite sides of the first island 121. Each of the structural units UD further includes another first bridge 124 connected between the first island 121 and the another second island 122. The first bridge 123 is connected between a second island 122 and the first side 121c of the first island 121, and the another first bridge 124 is connected between the another second island 122 and the second side 121d of the first island 121. Each of the structural units UD further includes another second part 220 of the gate driving circuit 200, and the another second part 220 of the gate driving circuit 200 is disposed on the another second island 122.

What is claimed is:

1. A stretchable pixel array substrate, comprising:
   a base, having an active area and a peripheral area outside the active area, wherein the peripheral area has a plurality of openings to define a plurality of first islands, a plurality of second islands, and a plurality of first bridges of the peripheral area, an area of each of the first islands is greater than an area of each of the second islands, and at least a part of the first bridges is connected between the first islands and the second islands;
   a plurality of pixel structures, disposed on the active area of the base; and
   a gate driving circuit, electrically connected to the pixel structures and comprising:
      a plurality of first parts, disposed on the first islands of the peripheral area of the base; and
      a plurality of second parts, disposed on the second islands of the peripheral area of the base and electrically connected to the first parts.

2. The stretchable pixel array substrate according to claim 1, wherein each of the first islands has an upper edge, a lower edge, a first side, and a second side, the upper edge is disposed opposite to the lower edge, the first side is connected between the upper edge and the lower edge, the second side is disposed opposite to the first side and is connected between the upper edge and the lower edge, a length of the upper edge is greater than or equal to a length of the lower edge, a length of the first side and a length of the second side is less than the length of the lower edge.

3. The stretchable pixel array substrate according to claim 2, wherein each of the second islands has a first side adjacent to the first island, and the first side of the second island and the first side of the first island form an acute angle.

4. The stretchable pixel array substrate according to claim 3, wherein the acute angle is θ, and 8°≤θ≤40°.

5. The stretchable pixel array substrate according to claim 4, wherein the acute angle is θ, and 10°≤θ≤35°.

6. The stretchable pixel array substrate according to claim 2, wherein each of the first islands has a width b in a direction parallel to the first side, one of the first parts of the gate driving circuit disposed on the first island has a width a in the direction, and b/6≤a≤2b/3.

7. The stretchable pixel array substrate according to claim 2, wherein one of the first parts of the gate driving circuit has a first edge and a second edge opposite to each other, the first edge and the second edge are respectively adjacent to the upper edge and the lower edge of each of the first islands, the second edge of the one of the first portions of the gate driving circuit has an arc-shaped structure concave toward the first edge.

8. The stretchable pixel array substrate according to claim 7, wherein a distance between the arc-shaped structure of the one of the first parts of the gate driving circuit and the lower edge of each of the first islands gradually changes as the distance moves away from the first side of the first island.

9. The stretchable pixel array substrate according to claim 1, wherein each of the first islands in the peripheral area of the base comprises a first part and a second part; the peripheral area of the base further has a second bridge, the second bridge is connected between the first part of the first island and the second part of the first island; the peripheral area of the base further has a meandering structure, the meandering structure is disposed opposite to the second bridge and connected between the first part of the first island and the second part of the first island.

10. The stretchable pixel array substrate according to claim 1, wherein the first parts of the gate driving circuit comprise a plurality of active elements, and the second parts comprise a plurality of passive elements.

11. The stretchable pixel array substrate according to claim 10, wherein each of the first islands has an upper edge, a lower edge, a first side, and a second side, the upper edge is disposed opposite to the lower edge, the first side is connected between the upper edge and the lower edge, the second side is disposed opposite to the first side and is connected between the upper edge and the lower edge, a length of the upper edge is greater than or equal to a length of the lower edge, a length of the first side and a length of the second side is less than the length of the lower edge, and the active elements are arranged along the upper edge of the first island.

12. The stretchable pixel array substrate according to claim 1, wherein the first islands in the peripheral area of the base, the second islands in the peripheral area of the base, the first bridges in the peripheral area of the base, and the gate driving circuit are divided into a plurality of structural units, each of the structural units comprises at least one of the first island, one of the second islands adjacent to the first island, one of the first bridges connected between the first island and the second island, and one of the first parts of the gate driving circuit and one of the second parts of the gate driving circuit respectively disposed on the first island and the second island; the structural units are arranged in a plurality of structural unit columns and a plurality of structural unit rows, and one of the structural unit rows and a next one of the structural unit rows are mirror-symmetrical to one another.

13. The stretchable pixel array substrate according to claim 12, wherein curving directions of the first islands of the structural units belonging to the same structural unit row and respectively belonging to two of the adjacent structural unit columns are opposite to each other.

14. The stretchable pixel array substrate according to claim 12, wherein the structural unit column and a next one of the structural unit columns are mirror-symmetrical to one another.

15. The stretchable pixel array substrate according to claim 12, wherein each of the structural units further comprises another one of the second islands adjacent to the first island, the second island and the another one of the second islands of each of the structural units are respectively located on opposite sides of the first island; each of the structural units further comprises another one of the first bridges connected between the first island and the another one of the second islands; each of the structural units further comprises another one of the second parts of the gate driving circuit, and the another one of the second parts of the gate driving circuit is disposed on the another one of the second islands.

* * * * *